US008633585B2

(12) United States Patent
Schmid et al.

(10) Patent No.: US 8,633,585 B2
(45) Date of Patent: Jan. 21, 2014

(54) DEVICE COMPRISING AN ENCAPSULATION UNIT

(75) Inventors: Christian Schmid, Regensburg (DE); Tilman Schlenker, Nittendorf (DE); Heribert Zull, Regensburg (DE); Ralph Paetzold, Roth (DE); Markus Klein, Tegernheim (DE); Karsten Heuser, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 190 days.

(21) Appl. No.: 12/865,646

(22) PCT Filed: Jan. 29, 2009

(86) PCT No.: PCT/DE2009/000134
§ 371 (c)(1),
(2), (4) Date: Nov. 17, 2010

(87) PCT Pub. No.: WO2009/095006
PCT Pub. Date: Aug. 6, 2009

(65) Prior Publication Data
US 2011/0049730 A1    Mar. 3, 2011

(30) Foreign Application Priority Data

Jan. 30, 2008 (DE) .................. 10 2008 006 721
Apr. 21, 2008 (DE) .................. 10 2008 019 900
Jul. 2, 2008 (DE) .................. 10 2008 031 405
Sep. 23, 2008 (DE) .................. 10 2008 048 472

(51) Int. Cl.
*H01J 23/06* (2006.01)

(52) U.S. Cl.
USPC ............. 257/729; 257/789; 257/62; 257/410; 136/249; 136/259

(58) Field of Classification Search
USPC ......... 136/259, 249; 205/50; 257/98, 99, 787, 257/3, 62, 410, 729; 315/512; 313/512
See application file for complete search history.

(56) References Cited

U.S. PATENT DOCUMENTS 4,177,473 A * 12/1979 Ovshinsky ............... 252/62.3 E
4,609,771 A *  9/1986 Guha et al. .................... 136/249
(Continued)

FOREIGN PATENT DOCUMENTS

CN          1899815        1/2007
DE    10 2004 041 497       3/2006
(Continued)

OTHER PUBLICATIONS

D.Giron,P.Remy,S.Thomas and E.Vilette;Journal of Thermal Analysis,vol. 48(1997)465-472;Quantitation of Amorphicity by Microcalorimetry.*

(Continued)

*Primary Examiner* — Eugene Lee
*Assistant Examiner* — Fang-Xing Jiang
(74) *Attorney, Agent, or Firm* — Cozen O'Connor

(57) ABSTRACT

A device in accordance with one embodiment comprises component (1) and an encapsulation arrangement (2) for the encapsulation of the component (1) with respect to moisture and/or oxygen, wherein the encapsulation arrangement (2) has a first layer (21) and thereabove a second layer (22) on at least one surface (19) of the component (1), the first layer (21) and the second layer (22) each comprise an inorganic material, and the second layer (22) is arranged directly on the first layer (21).

13 Claims, 6 Drawing Sheets

(56) References Cited

U.S. PATENT DOCUMENTS

| | | | |
|---|---|---|---|
| 5,296,716 A * | 3/1994 | Ovshinsky et al. | 257/3 |
| 6,933,002 B2 | 8/2005 | Tera et al. | |
| 7,071,506 B2 | 7/2006 | Moon et al. | |
| 7,265,807 B2 | 9/2007 | Lifka et al. | |
| 7,291,890 B2 * | 11/2007 | Visokay et al. | 257/410 |
| 7,982,309 B2 * | 7/2011 | Vervoort et al. | 257/729 |
| 2001/0001504 A1 | 5/2001 | Sugiyama et al. | |
| 2001/0031379 A1 | 10/2001 | Tera et al. | |
| 2002/0003403 A1 | 1/2002 | Ghosh et al. | |
| 2003/0036620 A1 | 2/2003 | Kawanabe et al. | |
| 2003/0085654 A1 | 5/2003 | Hyashi | |
| 2003/0129298 A1 | 7/2003 | Tera et al. | |
| 2003/0214232 A1 | 11/2003 | Guenther et al. | |
| 2004/0201027 A1 * | 10/2004 | Ghosh | 257/99 |
| 2005/0041193 A1 | 2/2005 | Lifka et al. | |
| 2005/0181535 A1 | 8/2005 | Yun et al. | |
| 2005/0248270 A1 * | 11/2005 | Ghosh et al. | 313/512 |
| 2006/0109397 A1 | 5/2006 | Anandan | |
| 2006/0246811 A1 | 11/2006 | Winters et al. | |
| 2006/0250084 A1 | 11/2006 | Cok et al. | |
| 2007/0026243 A1 | 2/2007 | Iwanaga et al. | |
| 2007/0273280 A1 | 11/2007 | Kim et al. | |
| 2007/0281174 A1 | 12/2007 | Moro et al. | |
| 2007/0295390 A1 | 12/2007 | Sheats et al. | |
| 2008/0018244 A1 | 1/2008 | Anandan | |
| 2010/0108524 A1 * | 5/2010 | van Mol et al. | 205/50 |
| 2010/0132762 A1 | 6/2010 | Graham, Jr. et al. | |
| 2011/0100458 A1 * | 5/2011 | Kang et al. | 136/259 |
| 2012/0187439 A1 * | 7/2012 | Bosch et al. | 257/98 |

FOREIGN PATENT DOCUMENTS

| | | |
|---|---|---|
| JP | 07-282975 | 10/1995 |
| JP | 2000-058777 | 2/2000 |
| JP | 2001-284042 | 10/2001 |
| JP | 2003-142255 | 5/2003 |
| JP | 2003-347042 | 12/2003 |
| JP | 2004-022281 | 1/2004 |
| JP | 2005-512299 | 4/2005 |
| JP | 2005-119148 | 5/2005 |
| JP | 2005-524946 | 8/2005 |
| JP | 2006-164543 | 6/2006 |
| JP | 2006-286220 | 10/2006 |
| JP | 2007-090803 | 4/2007 |
| JP | 2009-514177 | 4/2009 |
| TW | 345727 | 11/1998 |
| TW | 469546 | 12/2001 |
| TW | 572925 | 1/2004 |
| TW | 200642517 | 12/2006 |
| WO | WO 03/050894 | 6/2003 |
| WO | WO 03/096440 | 11/2003 |
| WO | WO 2006/134812 | 12/2006 |
| WO | WO 2006/135474 | 12/2006 |
| WO | WO 2007/051301 | 5/2007 |

OTHER PUBLICATIONS

PerkinElmer Life and Analytical Sciences; Qauntitation of the Amorphicity of Lactose Using Material Pockets; www.perkinelmer.com;@2007 PerkinElmer, Inc, All right reserved.*

Woong-Sun Kim et al., "Deposition of $Al_2O_3$ by Using ECR-ALD for Organic Substrate Devices", Journal of the Korean Physical Society, Jul. 1, 2009. (pp. 55-58).

P. K. Sang-Hee et al., "Ultrathin Film Encapsulation of an OLED by ALD" Electrochemical and Solid-State Letters, vol. 8, No. 2, pp. H21-H23, Jan. 6, 2005.

H. Lifka et al. "Thin Film Encapsulation of OLED Displays with a Nonon Stack", 2004 SID International Symposium Digest of Technical Papers, vol. 35, No. 2, pp. 1384-1387, May 26, 2004.

E. Langereis et al., "Plasma-assisted atomic layer deposition of Al2O3 moisture permeation barriers on polymers", Applied Physics Letters, vol. 89, No. 8, pp. 81915-081915 , 2006.

S. Yun et al., "Passivation of organic light-emitting diodes with aluminum oxide thin films grown by plasma-enhanced atomic layer deposition", Applied Physics Letters, vol. 85, No. 21, pp. 4896-4898, Jan. 1, 2004.

W. Potscavage et al., "Encapsulation of pentacene/C60 organic solar cells with Al2O3 deposited by atomic layer deposition", Applied Physics Letters, vol. 90, No. 25, pp. 253511-253511, Jun. 21, 2007.

S-H K. Park et al., "Ultra Thin film Encapsulation of Organic Light Emitting Diode on a Plastic Substrate", ETRI Journal, vol. 27, No. 5, pp. 545-550, Oct. 2005.

* cited by examiner

DEVICE COMPRISING AN ENCAPSULATION UNIT

RELATED APPLICATIONS

This is a U.S. national stage of application No. PCT/DE2009/000134, filed on Jan. 29, 2009.

This patent application claims the priorities of German patent application 10 2008 006 721.0 filed Jan. 30, 2008, of German patent application 10 2008 019 900.1 filed Apr. 21, 2008, of German patent application 10 2008 031 405.6 filed Jul. 2, 2008 and of German patent application 10 2008 048 472.5 filed Sep. 23, 2008, the disclosure contents of all of which are hereby incorporated by reference.

FIELD OF THE INVENTION

The present invention is related to a device with an encapsulation arrangement.

BACKGROUND OF THE INVENTION

Moisture-sensitive displays comprising organic light-emitting diodes (OLEDs) are nowadays encapsulated by means of complicated covering glass devices that enclose the active regions of the OLED display in a cavity. In this case, the covering glass is usually adhesively bonded on a substrate by means of an adhesive layer extending around the active regions of the OLED display, which adhesive layer, however, is often not permanently impermeable with respect to moisture and/or oxygen on account of the material used and/or on account of mechanical loading. Therefore, it is necessary, in the case of known OLED displays of this type, for getter materials that can bind moisture and/or oxygen additionally to be introduced into the cavity between substrate and covering glass.

However, encapsulation solutions of this type make stringent requirements of the materials used and are usually time- and cost-intensive in production.

SUMMARY OF THE INVENTION

One object of at least one embodiment is to specify a device comprising a component and an encapsulation arrangement for the encapsulation of the component with respect to moisture and/or oxygen.

A device in accordance with at least one embodiment comprises, in particular, a component and an encapsulation arrangement. In this case, the encapsulation arrangement is suitable for encapsulating the component with respect to moisture and/or oxygen.

Here and hereinafter, "encapsulate" and "encapsulation" denote the property of the encapsulation arrangement for forming a barrier with respect to moisture and/or oxygen, such that the encapsulation arrangement cannot be penetrated by these substances. By way of example, the encapsulation arrangement can be arranged between the component and an ambient atmosphere comprising moisture and/or oxygen, such that the component is protected against the ambient atmosphere. In this case, the encapsulation arrangement alone can be sufficient to encapsulate the component, for example by virtue of the fact that the encapsulation arrangement completely surrounds the component. Furthermore, "encapsulate" and "encapsulation" by the encapsulation arrangement can also mean that the encapsulation arrangement together with further elements mentioned hereinafter such as, for instance, a substrate or a covering encapsulates the component.

Here and hereinafter, "encapsulate" and "encapsulation" can primarily denote a hermetically impermeable sealing and barrier with respect to moisture and/or oxygen. That can mean that moisture and/or oxygen cannot penetrate through the encapsulation arrangement. In particular, the hermetically impermeable encapsulation arrangement can protect the component against moisture and/or oxygen in such a way that said component is not impaired and damaged in terms of its functionality and/or composition by moisture and/or oxygen from the ambient atmosphere.

By way of example, the component can have at least one element or partial region which is sensitive to moisture and/or oxygen. The element or the partial region can be impairable in terms of its functionality and/or composition by moisture and/or oxygen, for example. What can be achieved by means of the encapsulation arrangement is that the moisture- and/or oxygen-sensitive element or the moisture- and/or oxygen-sensitive partial region is protected.

Furthermore, the component can have at least one element or partial region which is permeable to moisture and/or oxygen, such that moisture and/or oxygen can penetrate into the element or the partial region and/or can penetrate through said element or said partial region. This can be possible, for example, as a result of absorption and/or diffusion of moisture and/or oxygen by the element or the partial region. What can be achieved by means of the encapsulation arrangement in this case is that moisture and/or oxygen cannot penetrate into the permeable element or the partial region and/or cannot penetrate through said element or said partial region.

The encapsulation arrangement can preferably have at least one first layer on at least one surface of the component and thereabove at least one second layer. The first layer can thus be arranged between the surface of the component and the second layer.

Here and hereinafter, "above", "at the top" and "there-above" denote arrangements of elements in a direction as viewed from the component. That can mean, in particular, that a second element which is arranged above a first element or which is arranged at the top as viewed from the first element is arranged on a side of the first element which is remote from the component.

In this case, the fact that one layer or one element is arranged or applied "on" another layer or another element can mean here and hereinafter that the one layer or the one element is arranged directly in direct mechanical and/or electrical contact on the other layer or the other element. Furthermore, it can also mean that the one layer or the one element is arranged indirectly on the other layer or the other element. In this case, further layers and/or elements can then be arranged between the one layer and the other layer or between the one element and the other element.

The fact that one layer or one element is arranged "between" two other layers or elements can mean here and hereinafter that the one layer or the one element is arranged directly in direct mechanical and/or electrical contact or in indirect contact with one of the two other layers or elements and in direct mechanical and/or electrical contact or in indirect contact with the other of the two other layers or elements. In this case, in the case of indirect contact, further layers and/or elements can then be arranged between the one layer and at least one of the two other layers or between the one element and at least one of the two other elements.

The encapsulation arrangement comprising at least the first and the second layers described here can enable an efficacious and effective encapsulation by the embodiments and exemplary embodiments described hereinafter. The effective encapsulation can be brought about precisely by the combination and the interaction of the at least one first and one second layer.

The first layer and the second layer can each comprise materials which are suitable for protecting the component against harmful influences of the surroundings, that is to say against oxygen and/or moisture, for instance, by the combination of the first with the second layer. The first layer and the second layer can, in particular, each comprise an inorganic material or each be composed of such a material.

The first layer can comprise or be composed of an oxide, a nitride or an oxynitride. By way of example, the oxide, nitride or oxynitride can comprise aluminum, silicon, tin, zinc, titanium, zirconium, tantalum, niobium or hafnium. Particularly preferably, the first layer can comprise silicon nitride ($Si_xN_y$), such as, for instance, $Si_2N_3$, silicon oxide ($SiO_x$), such as, for instance, $SiO_2$, aluminum oxide, for instance $Al_2O_3$, and/or titanium oxide, for instance $TiO_2$. Furthermore, the first layer can also comprise a transparent conductive oxide (TCO), as described further below. As an alternative or in addition, the first layer can comprise or be composed of a metal or an alloy. In this case, the first layer can comprise aluminum or an aluminum alloy, for example. As an alternative or in addition, the first layer can also comprise one of the metals mentioned above in connection with the oxides, nitrides and oxynitrides.

The first layer can have a volume structure in the form of a ceramic layer and/or in the form of a crystalline, polycrystalline, amorphous and/or vitreous structure.

The abovementioned materials can be applied for the production of the first layer by means of plasma-enhanced chemical vapor deposition (PECVD), for example. In this case, a plasma can be produced in a volume above and/or around the component, wherein at least two gaseous starting compounds are fed to the volume, which starting compounds can be ionized in the plasma and excited to react with one another. As a result of the production of the plasma, it can be possible that the temperature to which the at least one surface of the component has to be heated in order to enable the first layer to be produced can be lowered in comparison with a plasmaless CVD method. That can be advantageous, in particular, if the component would be irreversibly damaged at a temperature above a maximum temperature. In the case of the components described further below, in particular, and in this case particularly in the case of the organic electronic components, the maximum temperature can be approximately 120° C., for example, such that the temperature at which the first layer is applied can be less than 120° C., and preferably less than or equal to 80° C.

As an alternative thereto, the first layer can be applied by means of a physical vapor deposition such as, for instance, sputtering, ion-assisted deposition methods or thermal evaporation.

Furthermore, the first layer can also comprise or be composed of a glass. In this case, the glass can comprise, for example, one or more of the oxides mentioned above. The glass can be capable of being applied or can be applied by means of plasma spraying.

In the case of plasma spraying, an arc can be produced in a so-called plasma torch between at least one anode and at least one cathode by means of high voltage, through which arc a gas or gas mixture can be conducted and thereby ionized. The gas or gas mixture can comprise, for example, argon, nitrogen, hydrogen and/or helium. By way of example, pulverulent material for the first layer can be sprayed into the plasma flow produced by the arc and the gas or gas mixture flow. The pulverulent material can be melted by the temperature of the plasma and be applied to the at least one surface of the component by means of the plasma flow. The pulverulent material can be provided, for example, having an average grain size of less than or equal to a few hundred micrometers, preferably less than or equal to 100 micrometers, and furthermore greater than or equal to 100 nanometers, preferably greater than or equal to 1 micrometer. The more finely the material is provided, that is to say the smaller the average grain size, the more uniformly the first layer can be applied. The more coarsely the material is provided, that is to say the larger the average grain size, the more rapidly the first layer can be applied. Furthermore, the structure and also the quality of the first layer can depend on the speed, the temperature and/or the composition of the plasma gas.

As an alternative to plasma spraying, a first layer comprising a glass can also be applied by means of flame spraying or by means of a thermal evaporation method.

The first layer can furthermore also have a layer sequence composed of at least two layers comprising different materials. That can mean that the layer sequence having at least two different layers is applied as the first layer. By way of example, the layer sequence can have a layer comprising an oxide and a layer comprising a nitride. The layer sequence can also have a plurality of first layers comprising a first material, for instance a nitride, and/or a plurality of second layers comprising a second material, for instance an oxide, which are applied alternately one on top of another. If a nitride-containing layer is designated by "N" and an oxide-containing layer by "O", then the first layer can have a layer sequence which is embodied, for example, in a succession NON or NONON or else ONO or ONONO. The layers of the layer sequence of the first layer can each have thicknesses of greater than or equal to 50 nanometers, and preferably greater than or equal to 100 nanometers. By virtue of the plurality of layers of a first layer embodied as a layer stack, it can be possible that the extent of lattice defects such as, for instance, pores or dislocations within the first layer is reduced and that lattice defects of a layer of the layer stack are restricted to this layer and do not extend through the entire first layer.

By virtue of the abovementioned methods for applying the first layer, the latter can be applied cost-effectively with a high growth rate. In particular, the first layer can have, after application, a thickness of greater than or equal to 50 nanometers, and particularly preferably a thickness of greater than or equal to 100 nanometers. Furthermore, the first layer can have a thickness of less than or equal to 2 micrometers, and preferably of less than or equal to 1 micrometer. By virtue of a first layer having such a thickness, the encapsulation arrangement, besides the encapsulation, can also enable a mechanical protection for the component with respect to damaging external influences.

By virtue of the abovementioned methods, in particular at temperatures of the component of less than 120° C., and particularly preferably of less than 80° C., the first layer can be capable of being applied directly on the component without the component or parts thereof being damaged.

The volume structure of the first layer can be present in crystalline and/or polycrystalline form, for example. In this case, it can be possible that the volume structure of the first layer has, for example, structure and/or lattice defects such as, for instance, dislocations, grain boundaries and/or stacking faults. In this case, the volume structure of the first layer can be governed by the application methods described above and/or by the surface structure of the surface on which the first layer is applied. By way of example, the component can have, on the at least one surface on which the encapsulation arrangement is arranged, contaminants in the form of dirt, dust or other particles which, for example, are governed by the production processes of the component itself. Such particles can partly cover and/or shade the surface of the component, such that the first layer cannot be applied uniformly and in an area-covering fashion on the surface of the component. This can foster the formation of undesired pores or holes in the first layer.

In particular both the abovementioned structure and lattice defects of the volume structure of the first layer and pores in the surface structure of the first layer can form undesired permeation paths for moisture and/or oxygen, which can enable or at least facilitate diffusion through the first layer.

Furthermore, the first layer can have, on the surface which is remote from the component and on which the second layer is arranged, a surface structure in the form of macroscopic topographic structures such as, for instance, slopes, elevations, angles, edges, corners, depressions, trenches, furrows, microlenses and/or prisms and/or in the form of microscopic topographic structures such as, for instance, a surface roughness and/or pores. In this case, structures of the surface structure which are resolvable by means of visible light are classed as macroscopic structure, while microscopic structures are precisely no longer resolvable by means of visible light. That can mean that structures designated as macroscopic here have dimensions of greater than or equal to approximately 400 nanometers, while microscopic structure have dimensions that are smaller than approximately 400 nanometers.

The surface structure can be governed by the above-mentioned application methods themselves or else be producible, in particular in the case of macroscopic structures, by suitable further method steps such as, for instance, deposition using a mask and/or subsequent processing by means of mechanical and/or chemical removing methods. Macroscopic structures can be suitable for refracting and/or scattering light, for example, in the case of a transparent encapsulation arrangement, in particular in the case of a device comprising a component (described further below) which is embodied as an OLED and in which light can be emitted through the encapsulation arrangement.

The second layer can be suitable for enabling, in combination with the first layer, the hermetically impermeable encapsulation arrangement. For this purpose, the second layer can be suitable, in particular, for sealing the abovementioned permeation paths which can occur in the first layer.

For this purpose, the second layer can be arranged directly on the first layer and in direct contact with the first layer. That can mean that the second layer has a common interface with the first layer and furthermore an upper surface remote from the common interface. The second layer can be embodied in such a way that it can at least partly or approximately follow the surface structure of the first layer, which can mean that, in particular, the upper surface of the second layer also at least partly or approximately follows the topographic structure of the interface.

The fact that the upper surface of the second layer at least partly follows the interface between the first layer and second layer and thus the surface structure of the second layer can mean here and hereinafter that the upper surface of the second layer likewise has a topographic surface structure. In this case, the topographic surface structure of the upper surface of the second layer can be embodied preferably identically or similarly to the topographic surface structure of that surface of the first layer which is remote from the component. "Identically" or "similarly" can mean, in connection with two or more topographic surface structures, in particular, that the two or more topographic surface structures have identical or similar height profiles with mutually corresponding structures such as, for instance, elevations and depressions. By way of example, the two or more topographic surface structures can in this sense each have elevations and depressions arranged laterally alongside one another in a specific characteristic succession which, by way of example, apart from relative height differences of the elevations and depressions, are identical for the two or more topographic surface structures.

In other words, one surface which at least partly follows the topographic surface structure of another area can have an elevation arranged above an elevation of the topographic surface structure of the other area and/or a depression arranged above a depression of the topographic surface structure of the other area. In this case, the relative height difference between adjacent elevations and depressions of the one surface can also be different than the relative height difference of the corresponding elevations and depressions of the topographic surface structure of the other area.

In other words, that can mean that the upper surface of the second layer and the interface between the first and second layers extend parallel or at least approximately parallel. The second layer can thus have a thickness which is independent or approximately independent of the surface structure of that surface of the first layer which is remote from the component. "Approximately parallel", "approximately independent" and "approximately constant" can mean, with regard to the thickness of the second layer, that the latter has a thickness variation of less than or equal to 10%, and particularly preferably of less than or equal to 5%, measured with respect to the total thickness of the second layer. Such an embodiment of the second layer with such a small thickness variation can also be referred to as so-called "conformal coating".

Furthermore, the second layer can have a thickness which is smaller than the dimensions of at least some structures and, in particular, the abovementioned macroscopic structures of the surface structure of the first layer. In particular, the second layer can also follow those microscopic structures of the surface structure of the first layer whose dimensions are larger than the thickness of the second layer.

The thickness of the second layer can furthermore be independent of a volume structure of the first layer. That can mean that the first layer has no thickness variation of greater than 10%, and particularly preferably no thickness variation of greater than 5%, including over the partial regions of the first layer in which abovementioned lattice and/or structure defects of the volume structure of the first layer are situated and which extend, in particular, as far as the common interface with the second layer.

Furthermore, the thickness of the second layer can, in particular, also be independent of openings, elevations, depressions and pores in that surface of the first layer which faces the second layer. In the case where such surface structures, with regard to their dimensions, are larger than the thickness of the second layer, these can be covered by the second layer with uniform and at least almost identical thickness in the above sense by means of the second layer following the surface structure. In the case where the surface structures, with regard to their dimensions, are less than or equal to the thickness of the second layer, the second layer can cover the surface structures without following the latter, and yet in this case likewise have a thickness that is at least almost constant in the above sense.

In particular, the second layer can seal openings and/or pores in the first layer which have a depth-to-diameter ratio of greater than or equal to 10, and particularly preferably of greater than or equal to 30. The encapsulation arrangement can have the at least approximately identical thickness of the second layer as described here in particular also when the first layer has a surface structure having overhanging structures, in particular overhanging macroscopic structures, having negative angles.

Furthermore, the second layer can have a volume structure that is independent of the surface structure of that surface of the first layer which faces the second layer. In addition, the second layer can have a volume structure that is independent of the volume structure of the first layer. That can mean that surface- and/or volume-specific properties and features of the first layer such as, for instance, the above-mentioned surface structures and/or lattice and/or structure defects in the volume structure of the first layer have no influence on the volume structure of the second layer.

The second layer can comprise an oxide, a nitride and/or an oxynitride as described in connection with the first layer. Particularly preferably, the second layer can comprise aluminum oxide, for instance $Al_2O_3$, and/or tantalum oxide, for instance $Ta_2O_5$.

In particular, the second layer can have a volume structure having a higher amorphicity, that is to say irregularity in the sense of short- and/or long-range order of the materials used, than the first layer. That can mean, in particular, that the second layer has such a high amorphicity that no crystallinity or crystal structure can be ascertained. In this case, the second layer can be completely amorphous, such that the materials forming the second layer do not have a measurable short- and/or long-range order, but rather have a purely statistical, irregular distribution.

As reference for ascertaining the amorphicity of the second layer and also of the first layer, use can be made in this case, for example, of a shallow angle measurement known to the person skilled in the art in an X-ray diffractometer, in which measurement no crystallinity in the form of a crystalline, partly crystalline and/or polycrystalline structure can be ascertained for an amorphous layer.

By way of example, an encapsulation arrangement comprising a second layer composed of $Al_2O_3$ and having a thickness of 10 nanometers on a first layer comprising two $SiN_x$ layers each having a thickness of 200 nanometers and therebetween an $SiO_2$ layer having a thickness of 100 nanometers was measured by means of grazing incidence X-ray diffraction (GIXRD). In this case, no crystalline material could be detected in the second layer by means of the GIXRD method.

Although layers having a crystalline, that is to say non-amorphous, volume structure often have a higher density than layers having an amorphous volume structure, it was surprisingly ascertained in association with the device comprising the encapsulation arrangement as described here that the second layer, if it has a high amorphicity, nevertheless enables, in combination with the first layer, a hermetically impermeable encapsulation arrangement. In particular, it can be advantageous in this case that the amorphous second layer does not continue structure and/or lattice defects of the first layer, such that, as a result, it is also not possible for any continuous permeation paths for moisture and/or oxygen to form through the encapsulation arrangement. Precisely by virtue of the combination of the first layer with the amorphous second layer it is possible to achieve an encapsulation arrangement which has a hermetic impermeability with respect to moisture and/or oxygen and, at the same time, a sufficiently large total thickness in order also to ensure a mechanical protection of the component.

The second layer can be producible on the first layer by a method in which the surface structure and/or the volume structure of the first layer have/has no influence on the volume structure of the second layer to be applied. The second layer can be producible, in particular, by means of a method such that the material or materials to be applied for the second layer can be applied without long-range order, that is to say in an irregular distribution for the production of an amorphous volume structure. In this case, by way of example, the second layer can be applied in the form of individual layers of the material or materials to be applied, so-called monolayers, wherein each of the monolayers follows the surface structure of the area to be coated. In this case, the constituents and materials of a monolayer can be statistically distributed and distributed and applied independently of one another on the entire area to be coated, wherein, particularly preferably, the entire area is covered continuously with the monolayer. In this case, the area to be coated can be that surface of the first layer which is remote from the component, or a monolayer that has already been applied on the first layer.

A method by which it can be possible to apply such individual layers can be designated as a variant of atomic layer deposition. Atomic layer deposition (ALD) can designate a method in which, in comparison with an above-described CVD method for the production of a layer on a surface, firstly a first of at least two gaseous starting compounds is fed to a volume in which the component is provided. The first starting compound can adsorb on the surface. For the encapsulation arrangement described here it can be advantageous if the first starting compound adsorbs irregularly and without a long-range order on the surface. After the surface has been preferably completely or almost completely covered with the first starting compound, a second of the at least two starting compounds can be fed. The second starting compound can react with the first starting compound, which has adsorbed at the surface as far as possible irregularly but preferably in a manner completely covering the area, as a result of which a monolayer of the second layer can be formed. As in the case of a CVD method, it can be advantageous for the at least one surface to be heated to a temperature above room temperature. As a result, the reaction for forming a monolayer can be initiated thermally. In this case, the surface temperature, which, for example, can also be the component temperature, that is to say the temperature of the component, can depend on the starting materials, that is to say the first and second starting compounds. By repeating these method steps, it is possible for a plurality of monolayers to be successively applied one on top of another. In this case, for the production of the encapsulation arrangement described here, it is advantageous if the arrangements of the materials or starting compounds of the individual monolayers are independent of one another from monolayer to monolayer, such that an amorphous volume structure can form not only laterally along the extension plane of the surface to be coated but also upward in height.

The first and second starting compounds can be, for example, in connection with the materials mentioned further above for the second layer, organometallic compounds such as, for instance, trimethylmetal compounds and also oxygen-containing compounds. In order to produce a second layer comprising $Al_2O_3$, it is possible, by way of example, to provide trimethylaluminum as first and water or $N_2O$ as second starting compound. As an alternative thereto, it is also possible to provide water or $N_2O$ as first starting compound.

In the case of water as first starting compound it was surprisingly ascertained that a monolayer composed of water can be applied directly on the surface of the component without damaging the component itself. A precondition here is that the time for which the water can stay on the surface of the component without the second starting compound being fed must be less than the diffusion time required by the water to diffuse into the component. This can be the case when the first and second starting compounds are fed alternately with a cycle rate in the range of from a few milliseconds up to 10 milliseconds or else a few tens of milliseconds.

A plasmaless variant of atomic layer deposition ("plasmaless atomic layer deposition", PLALD) can in this case denote an ALD method for which no plasma is produced, as described hereinafter, rather in which, for forming the monolayers, the reaction of the above-mentioned starting compounds is only initiated by means of the temperature of the surface to be coated.

In the case of a PLALD method, the temperature of the at least one surface and/or of the component can be, for example, greater than or equal to 60° C. and less than or equal to 120° C.

A plasma-enhanced variant of atomic layer deposition ("plasma-enhanced atomic layer deposition", PEALD) can denote an ALD method in which the second starting compound is fed with the plasma being produced at the same time, as a result of which, as in the case of PECVD methods, it can be possible for the second starting compound to be excited. As a result, in comparison with a plasmaless ALD method, the temperature to which the at least one surface is heated can be reduced and the reaction between starting compounds can nevertheless be initiated by the production of plasma. In this case, the monolayers can be applied, by way of example, at a temperature of less than 120° C., and preferably less than or equal to 80° C. In order to produce further monolayers, the steps of feeding the first starting compound and then feeding the second starting compound can be repeated.

The degree of amorphicity of the second layer can be implemented by the choice of suitable starting compounds, temperatures, plasma conditions and/or gas pressures.

The second layer can have, after application, a thickness of greater than or equal to 1 nanometer, preferably of greater than or equal to 5 nanometers, and particularly preferably of greater than or equal to 10 nanometers, and less than or equal to 500 nm. In particular, the second layer can have a thickness of less than or equal to 200 nanometers, preferably less than or equal to 100 nanometers, and particularly preferably of less than or equal to 50 nanometers. That can mean that the second layer has greater than or equal to 1 monolayer, preferably greater than or equal to 10 monolayers and less than or equal to 5000 monolayers of the materials of the second layer.

In this case, a monolayer usually corresponds to approximately one-tenth of a nanometer. By virtue of the high density and quality of the second layer, such a thickness can be sufficient to ensure an effective protection against moisture and/or oxygen for the underlying component in combination with the first layer. The smaller the thickness of the second layer, the lower the time and material outlay for the production of the second layer, as a result of which a high economic viability can arise. The thicker the second layer, the more durable the second layer can be with respect to mechanical impairments, for example, and the greater can be the resistance of the hermetic encapsulation property of the encapsulation arrangement.

On account of the small thickness of the second layer, a short process time and thus a high economic viability of the encapsulation arrangement described here can be ensured. The encapsulation arrangement can be arranged, in particular, directly and right on the component. That can mean that the first layer of the encapsulation arrangement is arranged directly and right on the component.

Furthermore, the encapsulation arrangement can have a third layer, which is arranged between the first layer and the component. In this case, the third layer can comprise, in particular, an inorganic material as described in connection with the second layer. Furthermore, the third layer can be amorphous. Moreover, the third layer can have one or more further features as described in connection with the second layer. Furthermore, the second and third layers can be embodied identically.

The first layer can be arranged directly and right on the third layer. Furthermore, the third layer can be arranged directly on the component. In this case, the third layer can enable for the first layer a homogeneous application surface independently of the surface of the component.

In particular, the encapsulation arrangement can be arranged directly on the surface of the component. That can mean that the first layer or, if appropriate, the third layer is arranged directly and right on the surface of the component. In particular, that can mean that the encapsulation arrangement does not have an organic planarization layer that is usually required in the case of known encapsulations, or does not have to be applied on such an organic planarization layer. The surface of the component can be formed, as explained hereinafter further below, for example by an electrode, an inorganic optical coupling-out layer or some other functional layer of the component.

Furthermore, the encapsulation arrangement can have a plurality of first and a plurality of second layers which are arranged alternately one above another on the component, wherein, of said first and second layers, the layer arranged closest to the component is a first layer. The first and second layers of the plurality of the first and second layers, respectively, can in each case be embodied identically or differently. In this case, a "plurality" can mean, in this and in other contexts in the present description, at least a number of two. Through such a repetition of the layer construction with the first and second layers, it is possible to improve the encapsulation of the component. Furthermore, the mechanical robustness of the encapsulation arrangement can be increased. Through a suitable choice of the materials of the respective first and second layers it is possible to adapt the optical properties of the encapsulation arrangement.

Furthermore, the device can have a plurality of encapsulation arrangements arranged on different surfaces of the component.

Furthermore, the encapsulation arrangement can have a protective layer on the second layer. In this case, the protective layer can be arranged directly on the second layer. In particular, the protective layer can enable an additional mechanical protection of the underlying first and second layers. The protective layer can have a thickness of greater than or equal to 1 micrometer and less than or equal to 100 micrometers. In particular, the protective layer can have a thickness of greater than or equal to 5 micrometers, and preferably a thickness of greater than or equal to 10 micrometers.

In this case, the protective layer can comprise an organic material, in particular for instance plastics such as, for instance, siloxanes, epoxides, acrylates such as, for example, methyl methacrylates, imides, carbonates, olefins, styrenes, urethanes or derivatives thereof in the form of monomers, oligomers or polymers and furthermore also mixtures, copolymers or compounds therewith. By way of example, the protective layer can comprise or be an epoxy resin, polymethyl methacrylate (PMMA), polystyrene, polycarbonate, polyacrylate, polyurethane or a silicone resin such as, for instance, polysiloxane or mixtures thereof. In this case, the protective layer can be transparent, for example.

The protective layer can furthermore comprise a spray coating or be embodied as a spray coating which comprises at least one of the abovementioned materials and which can be applied by means of a continuous spray coating installation, for example. The spray coating can furthermore be a UV-curable and/or a binder- or solvent-containing spray coating.

By virtue of the fact that the first and second layers of the encapsulation arrangement enable a hermetic encapsulation of the component, the protective layer can also comprise materials which are actually incompatible with the component since they are damaging to said component, for example. Thus, the protective layer can be applied for example as a solution with a solvent which would have a harmful influence for the unencapsulated component.

That surface of the component on which the encapsulation arrangement is arranged can be planar or curved. Furthermore, the surface can also have at least two surface regions which are tilted relative to one another concavely or convexly with respect to one another. In this case, the surface can also have one or more edges and/or corners. For this purpose, by way of example, two or more of the surface regions of the surface can form a common edge and/or corner. Furthermore, as mentioned further above, particles, dirt or dust can have settled on the surface of the component, and cause an irregular surface structure.

The component can have a substrate or be a substrate. In this case, the substrate can be suitable, for example, as a carrier element for electronic elements, in particular optoelectronic elements. By way of example, the substrate can comprise or be composed of glass, quartz and/or a semiconductor material. Furthermore, the substrate can comprise or be composed of a plastic film or a laminate having one or more plastic films. The plastic can comprise one or more polyolefins such as, for instance, high and low density polyethylene (PE) and polypropylene (PP). Furthermore, the plastic can also comprise polyvinyl chloride (PVC), polystyrene (PS), polyester and/or preferably polycarbonate (PC), polyethylene terephthalate (PET), polyether sulfone (PES) and/or polyethylene naphthalate (PEN).

Furthermore, the substrate can comprise metal, in particular a metal film, for instance. A substrate which comprises a metal film or a substrate which is embodied as a metal film can comprise, for example, an aluminum film, a copper film, a high-grade steel film or a combination or a layer stack composed thereof.

The substrate can comprise one or more of the abovementioned materials and in this case be embodied as transparent, partly transparent or else opaque.

In this case, the substrate can be, at least in a partial region, sensitive to moisture and/or oxygen or alternatively or additionally permeable to moisture and/or oxygen. In this case, the surface on which the encapsulation arrangement is arranged can comprise or be a substrate surface in the sensitive and/or permeable partial region. The encapsulation arrangement can thus result in a sealing of the substrate with respect to the ambient atmosphere, such that the substrate can be protected, on the one hand. On the other hand, the encapsulation arrangement can seal the permeable partial region of the substrate, such that the device comprising the substrate with the encapsulation arrangement can also be embodied as a hermetically impermeable substrate on which, for example, moisture- and/or oxygen-sensitive further components can be applied.

In the case of a moisture- and/or oxygen-transmissive and/or -sensitive substrate material, the substrate can also be completely enclosed by the encapsulation arrangement, such that the encapsulation arrangement is arranged on all of the substrate surfaces. As a result, it is possible to utilize for the device substrate materials which are intrinsically not impermeable and on which further elements can be applied, as described below in connection with the component.

By way of example, the substrate can comprise or be composed of a plastic film which can be suitable for the device with regard to its mechanical properties such as flexibility, for instance. In this case, however, the plastic of the substrate can be, for example, permeable to moisture and/or oxygen and/or have a water diffusion rate that is unsuitably high for the device and/or the component. By virtue of the arrangement of the encapsulation arrangement on one or preferably on all of the surfaces of the substrate, the latter can furthermore have its mechanical properties and at the same time be impermeable with respect to moisture and/or oxygen as a result of the encapsulation arrangement.

Furthermore, the substrate can also have at least one first substrate layer and one second substrate layer, wherein, by way of example, the second substrate layer is permeable and/or sensitive to moisture and/or oxygen, while the first substrate layer is impermeable and insensitive to moisture and/or oxygen. In this case, the encapsulation arrangement can be arranged above or directly on the second substrate layer, such that the first and second substrate layers are completely enclosed by the encapsulation arrangement or such that the second substrate layer is completely enclosed together by the encapsulation arrangement and the first substrate layer.

The first substrate layer can be a metal film, for example, on which the second substrate layer is applied in the form of a planarizing plastic layer comprising a plastic which, for example, is permeable to moisture and/or oxygen. Such a planarizing plastic layer can be advantageous in particular owing to a roughness that is unsuitably high for components such as are described hereinafter. An unsuitably high water conductivity or water permeability of the plastic layer can once again be prevented by the encapsulation arrangement. A second substrate layer embodied as a planarizing plastic layer can comprise one of the abovementioned plastic materials and alternatively or additionally also further polymers, in particular fluorinated polymers, parylenes, cyclotenes, polyacrylates and combinations or layer sequences.

Furthermore, the component can be embodied as an electronic component. In particular, the component can comprise an inorganic light emitting diode (LED), organic light emitting diode (OLED), an inorganic photodiode (PD), an organic photodiode (OPD), an inorganic solar cell (SC), an organic solar cell (OSC), an inorganic transistor, in particular an inorganic thin film transistor (TFT), an organic transistor, in particular an organic thin film transistor (OTFT), an integrated circuit (IC) or a plurality or combination of the elements mentioned or can be embodied in this way.

A component embodied as an electronic component can have a substrate, for example. In this case, the substrate can be embodied in accordance with the description above. Furthermore, the substrate can already be embodied as a device in accordance with the present description comprising a first encapsulation arrangement. The device embodied as a substrate can thus serve as a hermetically impermeable substrate for the component of a superordinate device having a second encapsulation arrangement in accordance with the present description for the encapsulation of, for example, functional regions and/or layers of the component.

The component can furthermore have a functional layer sequence having at least one first and one second electrode, between which one or more inorganic and/or organic functional layers are arranged. In particular, the functional layer sequence can be arranged on a substrate.

If the component comprises for example an LED, an OLED, a PD, an OPD, an SC and/or an OSC, the functional layer sequence can have an active region suitable for generating or detecting electromagnetic radiation during the operation of the component or device. Furthermore, the component can have a transparent substrate. Furthermore, as an alternative or in addition, the encapsulation arrangement can also be at least partly transparent to the electromagnetic radiation emitted or detected during operation.

Furthermore, the first electrode and/or the second electrode can be transparent and, for example, comprise a transparent conductive oxide or consist of a transparent conductive oxide. An electrode comprising such a material can be embodied, in particular, as an anode, that is to say as hole-injecting material. Transparent conductive oxides ("TCO" for short) are transparent, conductive materials, generally metal oxides such as, for example zinc oxide, tin oxide, cadmium oxide, titanium oxide, indium oxide or indium tin oxide (ITO). Alongside binary metal-oxygen compounds such as, for example, $ZnO$, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

Furthermore, the first and/or the second electrode can comprise a metal which can serve, for example, as cathode material, that is to say as electron-injecting material. Inter alia, in particular aluminum, barium, indium, silver, gold, magnesium, calcium or lithium and compounds, combinations and alloys thereof can prove to be advantageous as cathode material. As an alternative or in addition, one or both electrodes can also comprise combinations, in particular layer sequences composed of TCOs and/or metals.

The one or more functional layers can comprise organic polymers, organic oligomers, organic monomers, organic small, non-polymeric molecules ("small molecules") or combinations thereof. In particular, it can be advantageous if a component embodied as an organic electronic component and comprising an OLED, OPD, OSC and/or an OTFT has a functional layer embodied as a hole transport layer in order, by way of example, in the case of an OLED, to enable effective hole injection into an electroluminescent layer or an electroluminescent region. By way of example, tertiary amines, carbazole derivatives, conductive polyaniline or polyethylene dioxythiophene can prove to be advantageous as materials for a hole transport layer.

Furthermore, it can be advantageous if a functional layer is embodied as an electroluminescent layer. Suitable materials for this purpose include materials which exhibit emission of radiation on account of fluorescence or phosphorescence, for example polyfluorene, polythiophene, polyphenylene or derivatives, compounds, mixtures or copolymers thereof. Depending on the materials in the functional layers, the generated first radiation can have individual wavelengths or ranges or combinations thereof from the ultraviolet to red spectral range.

If the component has an LED, PD, SC and/or a TFT, the one or more functional layers can have or be embodied as an epitaxial layer sequence, an epitaxially grown semiconductor layer sequence. In this case, the semi-conductor layer sequence can comprise, for example, a III-V compound semi-conductor on the basis of InGaAlN, InGaAlP and/or AlGaAs and/or a II-VI compound semi-conductor comprising one or more of the elements Be, Mg, Ca and Sr and one or more of the elements O, S and Se. By way of example, the II-VI compound semiconductor materials include ZnO, ZnMgO, CdS, ZnCdS and MgBeO.

A component having one or more OLEDs and/or one or more LEDs can be embodied, in particular, as an illumination device or as a display and can have an active luminous area embodied in large-area fashion. In this case, "in large-area fashion" can mean that the component has an area of greater than or equal to a few square millimeters, preferably greater than or equal to one square centimeter, and particularly preferably greater than or equal to one square decimeter.

The abovementioned enumeration of the embodiments of the component should not be understood to be restrictive. Rather, the component can have further electronic elements and/or functional layer sequences which are known to the person skilled in the art and which will therefore not be explained any further here.

The encapsulation arrangement can be arranged on one or more surfaces of the functional layer sequences described above. If the component has a substrate on which the functional layer sequence is arranged, then the encapsulation arrangement can extend over at least one partial region of the substrate and the functional layer sequence, such that the functional layer sequence is completely enclosed by the substrate and the encapsulation arrangement. If the component has a moisture- and/or oxygen-permeable and/or -sensitive substrate as described above, the component can be completely enclosed by the encapsulation arrangement. That can mean that the encapsulation arrangement is arranged on all uncovered surfaces of the component and thus on all uncovered surfaces of the substrate and of the functional layer sequence.

As an alternative or in addition, a first encapsulation arrangement can be arranged directly on the substrate, the substrate being encapsulated by means of said first encapsulation arrangement. The functional layer sequence can be arranged on the substrate encapsulated in this way and can be encapsulated by means of a second encapsulation arrangement. In this case, the first and second encapsulation arrangements can be embodied identically or differently with respect to one another and can have one or more of the features mentioned above.

Furthermore, the component can have, for example, a covering in the form of a cover above a substrate with the functional layer sequence. The encapsulation arrangement can be arranged, for example, between the covering and the substrate. The covering can, in particular, be laminated onto the substrate for example by means of a connecting material extending around the functional layer sequence, for instance a glass solder, glass frits and/or an adhesive. In this case, the encapsulation arrangement can be arranged circumferentially on the connecting material and/or on the substrate and/or on the covering. As a result, it can be possible that possible permeation paths for moisture and/or oxygen through the connecting material and/or along the interfaces between the connecting material and the substrate and/or the covering can be sealed.

In this case, the devices and encapsulation arrangements described here can be hermetically impermeable even under extreme ambient conditions. By way of example, the devices and encapsulation arrangements described here can be hermetically impermeable at an elevated temperature, for example greater than or equal to 40° C., greater than or equal to 60° C., and in particular even greater than or equal to 85° C., and at relative air humidities of greater than or equal to 85%, and in particular greater than or equal to 90%, for more than 500 hours. Such requirements are imposed, for example, on devices for automotive applications which are required according to automotive standards known to the person skilled in the art such as, for instance, the standard AEC Q101 or the basic standard thereof JEDEC JESD22-A101 or the standard IEC 68-2-78. Typical test conditions which can be derived from these standards are in this case, for example, 60° C., 90% relative air humidity, 85° C., 85% relative air humidity or 440° C., 93% relative air humidity, under which devices to be tested have to remain functional for more than 12 hours, 16 hours, 24 hours, 2, 4, 10, 21 or 56 days. With regard to the encapsulation arrangements described here, this means that they remain hermetically impermeable under the conditions mentioned.

By way of example, the encapsulation arrangements described here can be hermetically impermeable for longer than 500 hours at a temperature of greater than or equal to 60° C. and a relative air humidity of greater than or equal to 85% or under one of the conditions mentioned above.

In accordance with the embodiments mentioned above, by way of example, a device comprising an encapsulation arrangement on a component embodied as an OLED was produced and tested for impermeability in a moisture test. In this case, the OLED had an active area of 1 square centimeter, which could be perceived as a luminous area ("luminous image") during the operation of the device. The encapsulation arrangement made it possible to have the effect that, at an ambient temperature of 60° C. and 90% relative air humidity, even after 504 hours, no new black spots whatsoever arose in the luminous image of the active area, or black spots already present after the production of the OLED did not grow. In this case, black spots denote usually circular regions in the luminous image which, when a voltage is applied, do not light up (any longer) and therefore appear dark or black relative to their luminous surroundings.

Consequently, the encapsulation arrangement described here can have a defect density of less than one defect per square centimeter.

DETAILED DESCRIPTION OF THE DRAWINGS

In the exemplary embodiments and figures, identical or identically acting constituent parts may in each case be provided with the same reference symbols. The illustrated elements and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

Figure 1:
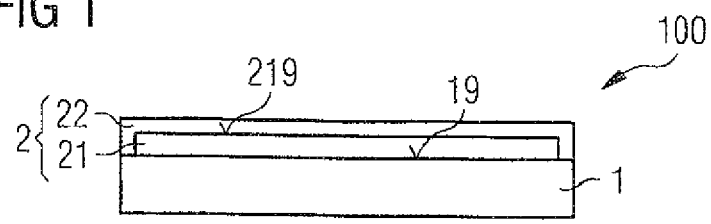
FIG. 1 shows a schematic illustration of a device in accordance with one exemplary embodiment.

FIG. 1 shows a device 100 in accordance with one exemplary embodiment. The device 100 has a component 1, which is indicated purely schematically in the exemplary embodiment shown and can be embodied in accordance with the description in the general part. In particular, the component 1 has a surface 19 that is sensitive to moisture and/or oxygen.

An encapsulation arrangement 2 is arranged on the surface 19 of the component 1. The encapsulation arrangement 2 has a first layer 21 and thereabove a second layer 22. In the exemplary embodiment shown, the first layer 21 is applied by means of a PECVD method directly on the surface 19 of the component and is composed of an inorganic material comprising silicon nitride. As a result of the PECVD method, the first layer 21 is produced with a crystalline to polycrystalline volume structure which, in the exemplary embodiment shown, has a thickness of a few hundred nanometers. As an alternative thereto, the first layer can also comprise other materials described in the general part, which, by way of example, can also be applied by means of the abovementioned further application methods on the surface 19 of the component 1.

The second layer 22 is applied directly on the surface 219 of the first layer 21 which is remote from the component 1. The surface 219 thus forms the interface between the first and second layers. The second layer 22 comprises an inorganic material and, in the exemplary embodiment shown, is composed of aluminum oxide, in particular. The aluminum oxide is applied by means of an atomic layer deposition method described in greater detail in the general part, said method being adapted with regard to the method parameters in such a way that the second layer has a volume structure embodied independently of the volume structure of the first layer. That means that the crystalline to polycrystalline volume structure of the first layer 21 that is present in the exemplary embodiment shown is not continued in the form of an epitaxial or epitaxy-like manner in the second layer 22 and therefore has no influence on the volume structure of the second layer 22. In this case, the second layer 22 is embodied in such a way that the volume structure of the second layer 22 has a greater amorphicity than the volume structure of the first layer 21. In particular, in the exemplary embodiment shown, the second layer 22 is amorphous and has no detectable crystallinity.

Figure 15:
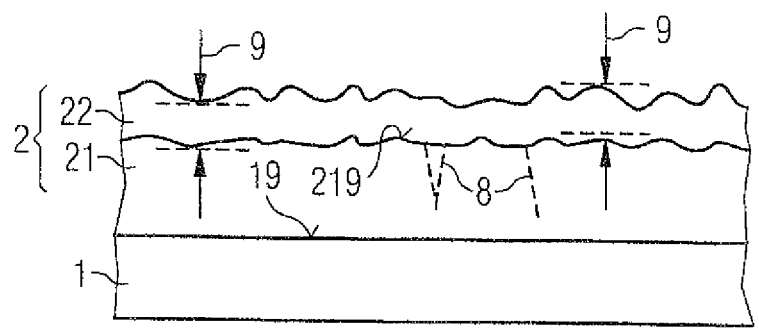
FIGS. 15 to 16C show schematic illustrations of excerpts from encapsulation arrangements in accordance with further exemplary embodiments.

In this connection, FIG. 15 shows an excerpt from the device 100 in which the encapsulation arrangement 2 comprising the first and second layers 21, 22 is illustrated in an enlarged fashion. As can be seen from FIG. 15, the surface 219 of the first layer 21, on which the second layer 22 is applied, has a surface structure in the form of a roughness, which is caused for example by the application method by which the first layer 21 is applied on the component 1.

Furthermore, the volume structure of the first layer 21 has structure and/or lattice defects 8 such as pores or dislocations, for instance, which are merely indicated schematically and purely by way of example. In this case, the structure and lattice defects 8 can continue, as shown, as far as the surface 219, that is to say as far as the interface between the first and second layers 21, 22. The structure and lattice defects 8 can, by way of example, also be brought about by particles and/or contaminants on the surface 19 which can cover and/or shade a region of the surface 19 during the application of the first layer 21, as a result of which a non-uniform application of the first layer 21 with an increased tendency toward the formation of structure and lattice defects 8 can be caused.

The second layer 22 is embodied in such a way that such structure and lattice defects 8 have no influence on the volume structure of the second layer 22. The second layer 22 is thus embodied with a uniformly amorphous volume structure and completely covers the first layer 21, as a result of which possible permeation paths for moisture and/or oxygen which are formed by lattice and structure defects 8 of the volume structure of the first layer 21 are also sealed. As a result, a hermetic encapsulation of the component 1 and in particular of the surface 19 with respect to moisture and/or oxygen can be made possible by means of the encapsulation arrangement 2, and in particular by means of the combination of the first and second layers 21, 22.

The second layer 22 furthermore has a thickness identified by the reference symbols 9 purely by way of example at two locations. As can be discerned in FIG. 15, the second layer 22 follows the surface structure of the surface 219 of the first layer in the manner described in the general part, such that the thickness 9 of the second layer 22 is almost independent of the surface structure of the first layer 21.

That means, in particular, that both the volume structure and the thickness variation of the thickness 9 of the second layer 22 are at least almost independent of the volume structure and independent of the surface structure of the first layer 21. In this case, the thickness variation of the thickness 9 is less than 10%. As is shown in FIG. 15, the second layer 22 is embodied in such a way that it can at least almost follow the microscopic structures of the surface structure of the first layer 21.

Figure 16A:
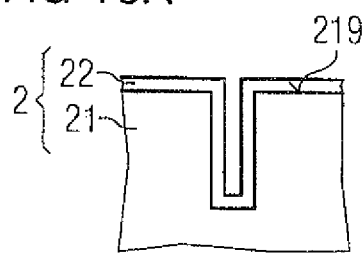
Figure 16B:
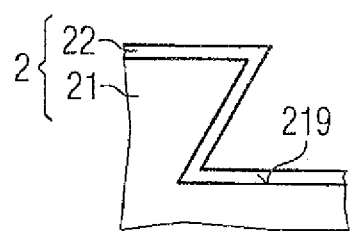
Figure 16C:
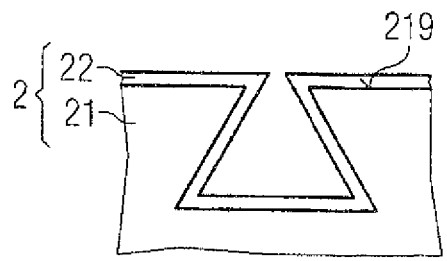

In accordance with FIGS. 16A to 16C, further excerpts from an encapsulation arrangement 2 are shown in this connection, in which excerpts the first layer 21 has surface structures having macroscopic structures shown purely by way of example. In FIG. 16A, the first layer 21 has in the surface 219 an opening or depression having a depth-to-diameter ratio of greater than 1. The second layer 22 follows the surface structure of the first layer 22 and in this case lines the surface of the opening with almost constant thickness. In this case, the depth-to-diameter ratio of the opening in the first layer 21 can be greater than or equal to 10, and particularly preferably also greater than or equal to 30.

In FIG. 16B, the surface 219 of the first layer 21 has an overhanging partial region, while the first layer 21 in FIG. 16C has a downwardly widening opening. Despite the negative angles for applying the second layer 22 to such structures of the surface structure of the first layer 21, the second layer can be formed with an almost constant thickness as shown in FIG. 15.

As an alternative or in addition to the structures shown in FIGS. 15 to 16C, the first layer 21, and in particular the surface 219 of the first layer 21, can have further structures and/or surface structures as described in the general part.

By virtue of the fact that the volume structure and the thickness of the second layer 22 are at least almost independent of the volume structure and the surface structure of the first layer, a uniform, homogeneous and completely covering arrangement of the second layer 22 on the first layer can be made possible. As a result, the encapsulation arrangement 2 can have the advantages of the first layer 21 in combination with the advantages of the second layer 22.

Further exemplary embodiments of devices which illustrate modifications of the exemplary embodiments shown in conjunction with FIGS. 1 and 15 to 16C are shown hereinafter.

Figure 2:
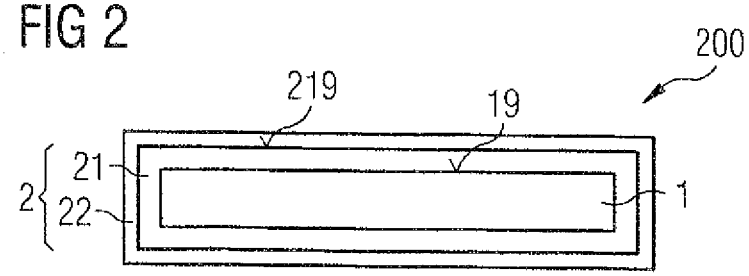
FIGS. 2 to 14 show schematic illustrations of devices in accordance with further exemplary embodiments.

FIG. 2 shows a device 200 in accordance with a further exemplary embodiment, in which the encapsulation arrangement 2 completely surrounds and encloses the component 1. That means that the surface 19 of the component 1 on which the first layer 21 and the second layer 22 are arranged encompasses all surfaces of the component 1. Consequently, the first and the second layers 21, 22 can make possible an encapsulation arrangement 2 which can also be arranged on different surfaces that are tilted and inclined relative to one another, and which can also extend over corners and edges.

The component 1 in FIG. 2 can be, for example, a flexible plastic film which is permeable per se to moisture and oxygen and which is intended to serve, for example, as a flexible substrate for an electronic component. By virtue of the encapsulation arrangement 2 which is arranged on all sides and which extends over all surfaces, corners and edges of the component 1, the device 200 shown is embodied as a flexible, hermetically impermeable substrate.

Figure 3:
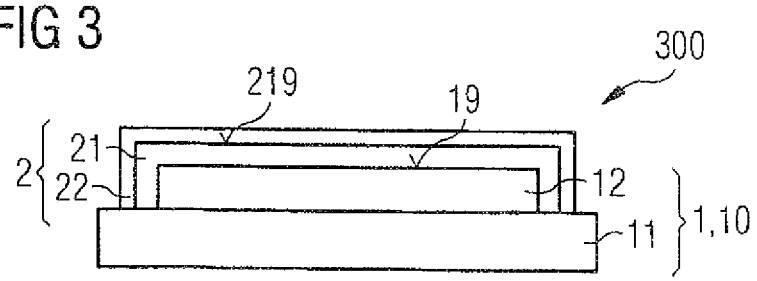

FIG. 3 shows a device 300 in accordance with a further exemplary embodiment, which, as in the previous exemplary embodiment, has for example a component 1 embodied as a substrate 10. The substrate 10 has a first substrate layer 11 and a second substrate layer 12 thereon. The first substrate layer 11 is embodied as a metal film, for instance as a high-grade steel film, which has a sufficient thickness to be impermeable with respect to moisture and oxygen. Metal films of this type are well suited as substrate materials for electronic components such as flexible OLEDs and/or flexible OPVs, for instance, on account of their flexibility, impermeability, stability and electrical conductivity. However, metal films usually have a relatively high surface roughness that necessitates either a complicated and cost-intensive smoothing method or a planarization layer.

In the exemplary embodiment shown, the second substrate layer 12 comprises a polymer, as mentioned in the general part, which is suitable for planarizing the first substrate layer 11 embodied as a metal film. However, since such polymers can usually be permeable to moisture and/or oxygen, an encapsulation arrangement 2 comprising a first and a second layer is arranged on the surface 19 of the substrate 10 which is formed by the second substrate layer 12. As a result, the second substrate layer 12 and therefore also the substrate 10 or the component 1 can be hermetically sealed and encapsulated against moisture and oxygen, such that the device 300 can likewise serve as a flexible, hermetically impermeable substrate. If the first and second layers 21, 22 comprise electrically conductive or electrically semiconducting materials as described in the general part, then the device 300 can additionally serve as an electrically conductive substrate.

Figure 4:
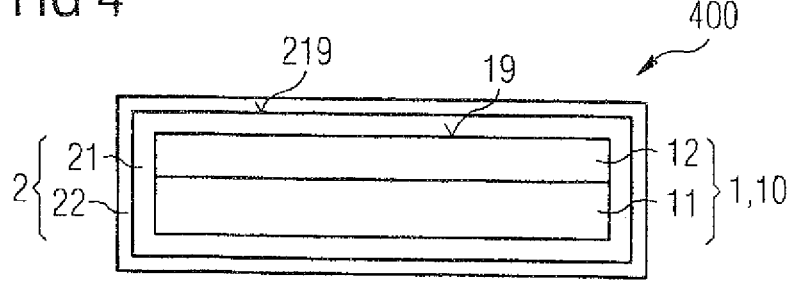

FIG. 4 shows a device 400 in accordance with a further exemplary embodiment, in which a component 1 embodied as a substrate 10 has a first and a second substrate layer 11, 12. The encapsulation arrangement 2 comprising the first and second layers 21, 22 is arranged on all uncovered surfaces of the first and second substrate layers 11, 12 and thus completely encloses and encapsulates the component 1 in the exemplary embodiment shown.

Figure 5:
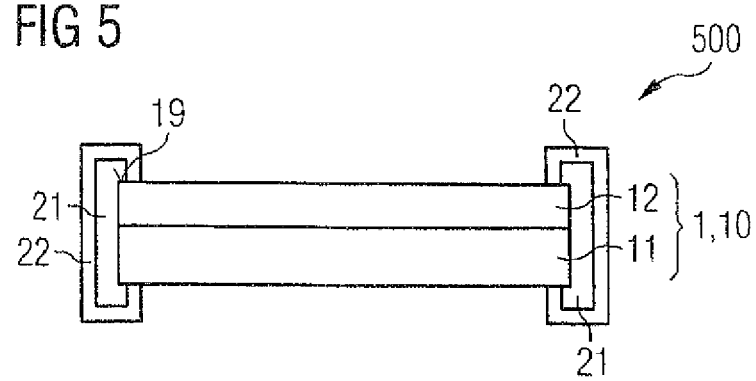

FIG. 5 shows a device 500 in accordance with a further exemplary embodiment, in which a component 1 embodied as a substrate 10 likewise has a first and a second substrate layer 11, 12. In the exemplary embodiment shown, the surface 19 of the component 1 on which the encapsulation arrangement 2 is applied comprises an edge region of the component 1 and covers, in particular, the connecting area or the connecting gap between the first and second substrate layers 11, 12. As a result, by way of example, connecting material such as an adhesive, for instance, by means of which the first and second substrate layers 11, 12 are laminated onto one another, can be encapsulated and protected against moisture and/or oxygen.

In addition to the components 1 embodied as substrates in the previous exemplary embodiments, the latter can also have further features of components in accordance with the general part of the description.

Figure 6:
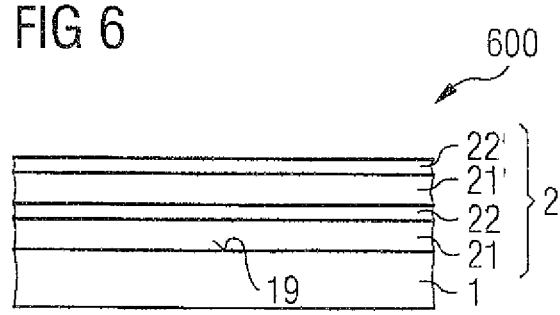

FIG. 6 shows an excerpt from a device 600 in accordance with a further exemplary embodiment, which in comparison with the exemplary embodiments shown previously, has an encapsulation arrangement 2 comprising a plurality of first layers and a plurality of second layers on a surface 19 of the component 1. In this case, the first layers 21, 21' and the second layers 22, 22' are arranged alternately one on top of another, beginning with the first layer 21 on the surface 19 of the component 1. In addition to the respectively two first and two second layers 21, 21', 22, 22' shown, the encapsulation arrangement 2 can have even further first and second layers.

The first and second layers 21, 21', 22, 22' can in each case be embodied identically or else differently than one another and, by way of example, also comprise different materials having different optical properties such as different refractive indices, for instance. By virtue of the repetition of the layer combination of first and second layers 21, 22 and 21', 22', it is also possible to increase the mechanical robustness of the encapsulation arrangement 2.

Figure 7:
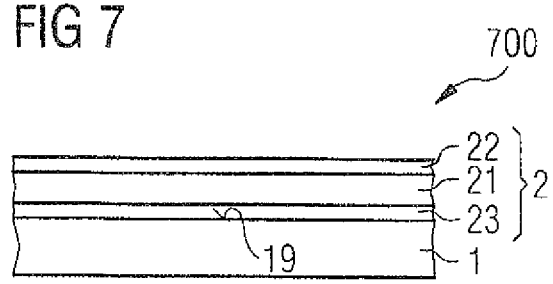

FIG. 7 shows an excerpt from a device 700 in accordance with a further exemplary embodiment, which has an encapsulation arrangement 2 comprising a third layer 23 in addition to the first and second layers 21, 22. In this case, the third layer 23 is arranged between the first layer 21 and the component 1 directly on the surface 19 of the component 1. The third layer 23 comprises an inorganic material which, by way of example, can be identical to the material of the second layer 22 and which is embodied like the second layer 22 with regard to its volume structure and the thickness variation. In particular, the third layer 23 is embodied in such a way that it follows the surface structure of the surface 19 of the component 1 and has an amorphous volume structure.

The third layer makes it possible, by way of example, to provide a conformal layer or surface for the arrangement of the first layer 21, as a result of which the quality of the first layer 21 can be increased.

All exemplary embodiments shown above and hereinafter can also have, as an alternative to the encapsulation arrangements shown, encapsulation arrangements in accordance with FIGS. 6 and/or 7 comprising a plurality of first and second layers 21, 21', 22, 22' and/or a third layer 23.

The following FIGS. 8 to 14 show devices comprising components 1 which are embodied purely by way of example as OLEDs. As an alternative or in addition thereto, the components 1 can also have features of other electrical components described in the general part.

The components 1 of the following exemplary embodiments have functional layers on a substrate, of which layers in each case purely by way of example a first and a second electrode 13 and 15 are shown, between which organic functional layers 14 having an active region are arranged. The active region is suitable for emitting electromagnetic radiation during the operation of the respective device or of the respective component. In this case, the components 1 embodied as OLEDs can have, for example, a transparent substrate and a transparent first electrode 13 arranged on the substrate below the organic functional layers 14, such that the electromagnetic radiation generated in the active region can be emitted through the substrate. An embodiment of this type can be referred to as a so-called "bottom emitter".

As an alternative or in addition, the second electrode 15, which is the top electrode as viewed from the substrate, can also be transparent, as can the encapsulation arrangement 2 or covering arranged thereabove, if appropriate. Devices of this type can emit the electromagnetic radiation generated in the active region in a direction directed away from the substrate and toward the top as viewed from the substrate and can be referred to as so-called "top emitters". A device which is embodied simultaneously as a bottom and top emitter can emit electromagnetic radiation on both sides during operation and can be transparent in the switched-off state.

In the case of a component embodied as a top emitter, a light coupling-out layer (not shown) comprising, by way of example, a selenide or a sulfide, for instance zinc selenide or zinc sulfide, can additionally be applied on the second electrode 15.

If the electromagnetic radiation generated in the active region is emitted through an encapsulation arrangement 2, then the second layer 22, in particular, can have a surface structure in the form of a radiation coupling-out structure having roughenings, microlenses and/or prisms. By virtue of the conformal second layer 22 following the surface structure of the first layer 21, an encapsulation arrangement 2 of this type can thus make possible in combination a hermetic sealing and encapsulation of the component 1 and also optical functionalities.

Figure 8:
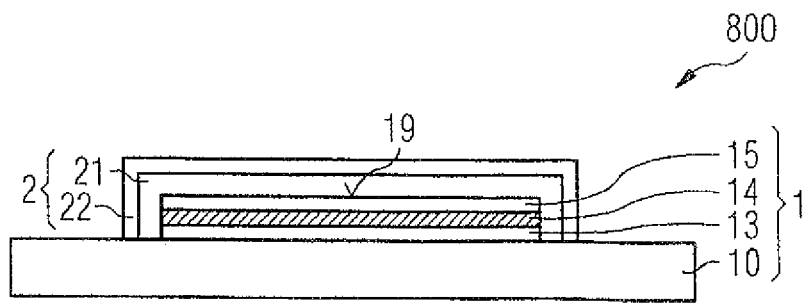

FIG. 8 shows an exemplary embodiment of a device 800, in which the encapsulation arrangement 2 comprising the first and second layers 21, 22 is arranged on the functional layers 13, 14 and 15. The substrate 10, on which the functional layers 13, 14 and 15 are applied, is composed of glass in the exemplary embodiment shown. In this case, in the exemplary embodiment shown, the substrate 10 has a thickness of approximately 700 micrometers, the functional layer 13 embodied as a first electrode composed of ITO has a thickness of approximately 118 micrometers, the layer 14 embodied as organic functional layers has a thickness of approximately 120 nanometers, and the functional layer 15 embodied as a second electrode composed of aluminum has a thickness of approximately 200 nanometers. The thickness of the first layer 21 of the encapsulation arrangement 2 is 500 nanometers and comprises a layer stack having an $SiN_x$ layer having a thickness of 200 nanometers, thereabove an $SiO_2$ layer having a thickness of 100 nanometers and thereabove a further $SiN_x$ layer having a thickness of 200 nanometers. The second layer 22 of the encapsulation arrangement 2 is composed of $Al_2O_3$ having a thickness of 10 nanometers. As described in the general part, in the case of this encapsulation arrangement 2, no crystalline $Al_2O_3$ could be detected in the second layer, such that the second layer is completely amorphous.

In the case of a device 800 of this type, as described in the general part, at 60° C. and 90% relative air humidity and with an active area of one square centimeter, after 504 hours, it was still not possible to detect any newly formed defect in the form of the black spots described above.

By virtue of the fact that the encapsulation arrangement 2 is arranged directly on the component 1 or directly on the functional layers 13, 14 and 15, without an additional organic planarization layer having to be used, the arrangement of the encapsulation arrangement 2 can be effected in a technically simple and uncomplicated manner. In the case of an organic planarization layer between the component 1 and the encapsulation arrangement 2, by contrast, it would be necessary to ensure in a technically complicated manner that the organic planarization layer, which is usually not hermetically impermeable with respect to moisture and oxygen, is completely covered and enclosed by the encapsulation arrangement since permeation paths to the functional layers 13, 14, 15 could otherwise be formed through the planarization layer.

Figure 9:
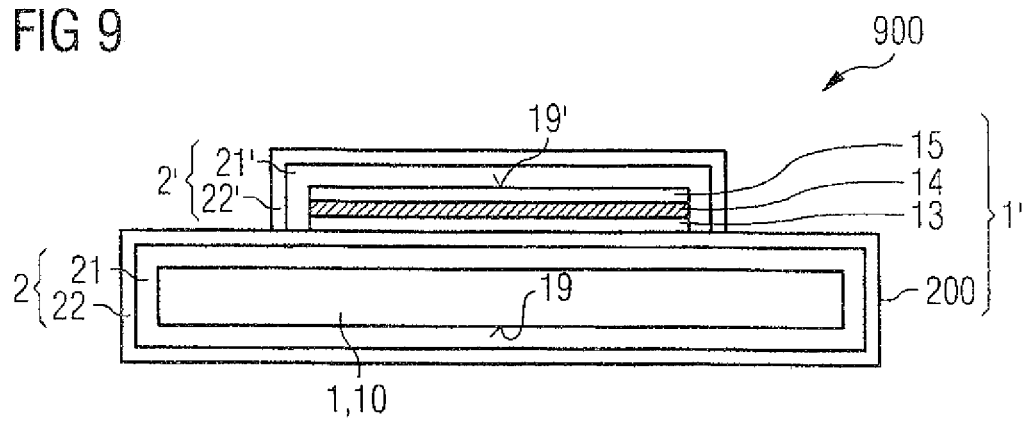

FIG. 9 shows a device 900 in accordance with a further exemplary embodiment, which has, as a substrate, the device 200 comprising the encapsulation arrangement 2 in accordance with FIG. 2. The functional layers 13, 14 and 15 arranged on the device embodied as a flexible and hermetically impermeable substrate are encapsulated with a further encapsulation arrangement 2' comprising a first layer 21' and a second layer 22'. In this case, the encapsulation arrangements 2 and 2' can be embodied identically or differently.

Figure 10:
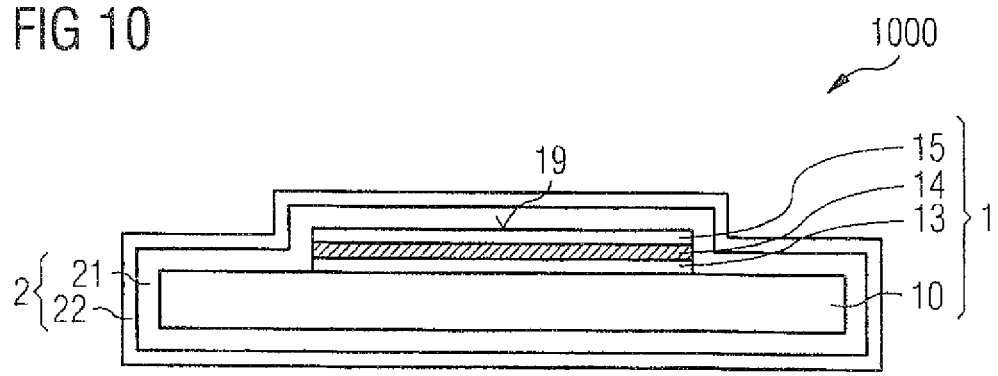

FIG. 10 shows a device 1000 in accordance with a further exemplary embodiment, in which, in contrast to the two previous exemplary embodiments, the substrate 10, for instance a plastic film, together with the functional layers 13, 14 and 15 are jointly encapsulated in a manner completely surrounded by the encapsulation arrangement 2.

FIGS. 11 to 14 show devices which have, in addition to the encapsulation of the functional layers 13, 14 and 15, a covering 17 in the form of a glass film or glass plate or else in the form of the device 200. The covering 17 is laminated on by means of a connecting material 16 extending around the functional layers 13, 14 and 15.

Figure 11:
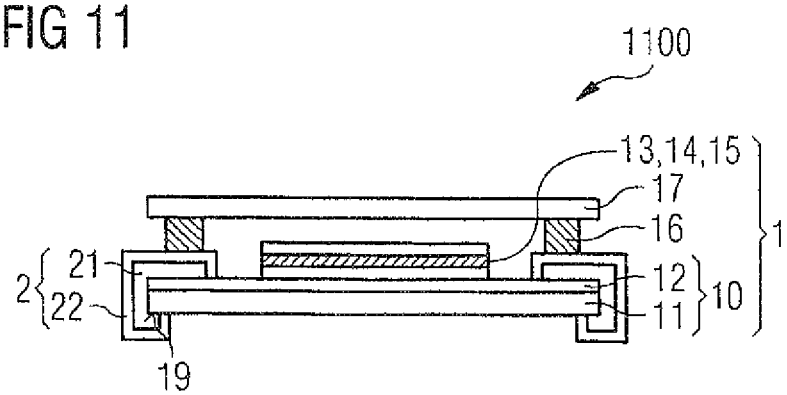

The device 1100 in accordance with the exemplary embodiment in FIG. 11 has a component 1 comprising a two-layered substrate 10 comprising a first and a second substrate layer 11, 12, which are encapsulated circumferentially in the edge region with an encapsulation arrangement 2. In this case, the first substrate layer 11 is embodied as a metal film and the second substrate layer 12 is embodied as a polymeric planarization layer, on which the functional layers 13, 14 and 15 are applied.

The encapsulation arrangement 2 extends, in a manner similar to that described in conjunction with FIG. 5, over the connecting location between the first and second substrate layers 21, 22 and further over a partial region of the second substrate layer 22. The connecting material 16 is applied on the encapsulation arrangement 2, such that the encapsulation arrangement 2 together with the covering 17 and the first substrate layer 21 encapsulates both the second substrate layer 22 and the functional layers 13, 14 and 15.

In the exemplary embodiment shown, the connecting material 16 is formed by glass frits which can terminate hermetically impermeably with the covering 17. For this purpose, the glass frit material can be sintered onto the covering 17, formed by a glass film or a glass plate, prior to application to the substrate 10. After application to the encapsulation arrangement 2 on the substrate 10, the connecting material 16 can be melted by means of a laser, for example, and thereby hermetically impermeably adjoin the encapsulation arrangement 2.

Figure 12:
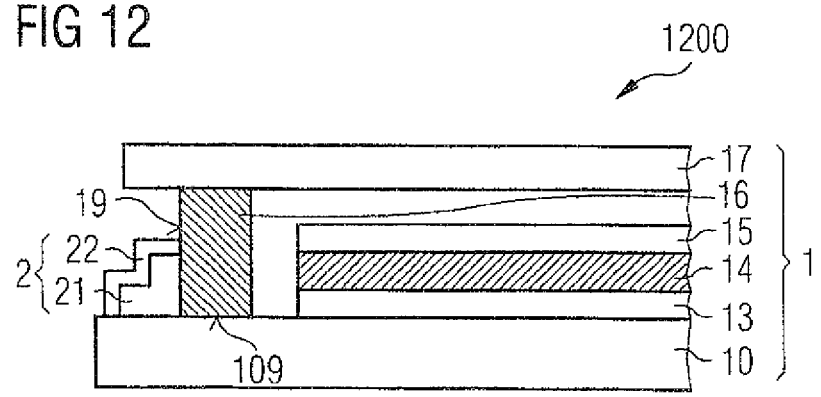

FIG. 12 shows an excerpt from a device 1200 in accordance with a further exemplary embodiment, which has a glass substrate as substrate 10 of the component 1. The encapsulation arrangement 2 is arranged circumferentially around the connecting material 16 on a partial region of the connecting material 16 and the substrate 10, such that the interface 109 between the connecting material 16 and the substrate 10 is sealed by the encapsulation arrangement 2. As a result, possible permeation paths for moisture and/or oxygen through the interface 109, which paths can form as a result of mechanical loading of the component 1, for example, can be permanently sealed.

The connecting material 16 in the exemplary embodiment shown is likewise composed of glass frits, which is sintered onto the covering 17 and melted onto the substrate 10, for instance a glass substrate, by means of a laser. Possible permeation paths which can arise along the interface between the substrate 10 and the connecting material as a result of the melting process can be effectively sealed by the encapsulation arrangement 2.

Figure 13:
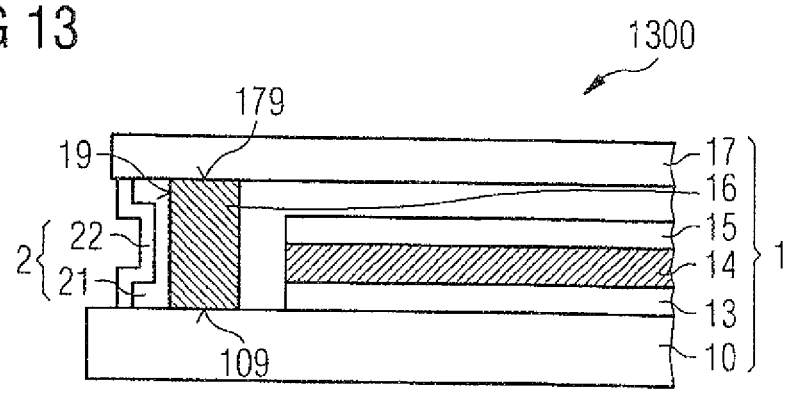
Figure 14:
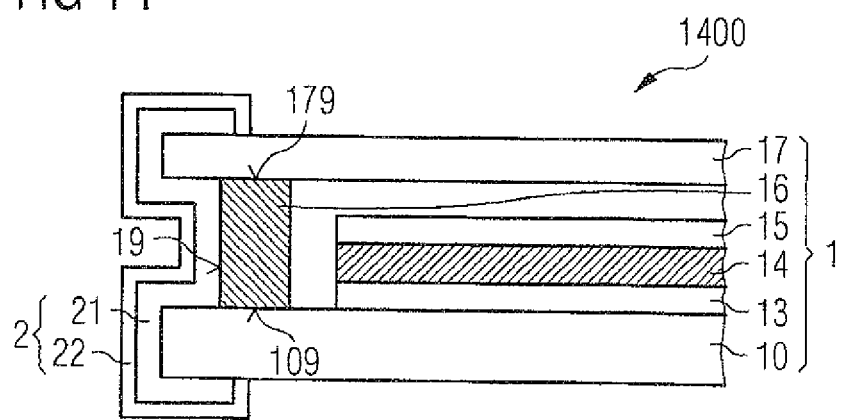

FIGS. 13 and 14 show excerpts from devices 1300 and 1400 in accordance with further exemplary embodiments, in which the encapsulation arrangement 2 additionally also extends over the entire connecting material 16 and the interface 179 between the connecting material 16 and the covering 17. As a result, the connecting material 16 and also the interface 179 can be permanently sealed by the encapsulation arrangement 2. As a result, by way of example, an adhesive which itself is not hermetically impermeable can be used as connecting material 16.

The encapsulation arrangement 2 of the device 1400 additionally also extends around the substrate 10 and the covering 17, as a result of which a higher stability can be achieved.

Furthermore, the encapsulation arrangements of the exemplary embodiments shown above can have on the second layer a protective layer (not shown) for example in the form of a spray coating for protection against mechanical damage.

The invention is not restricted to the exemplary embodiments by the description on the basis of said exemplary embodiments. Rather, the invention encompasses any novel feature and also any combination of features which in particular includes any combination of features in the patent claims, even if this feature or this combination itself is not explicitly specified in the patent claims or exemplary embodiments.

The invention claimed is:

1. A device comprising:
a component; and
an encapsulation arrangement for the encapsulation of the component with respect to moisture and/or oxygen,
wherein the encapsulation arrangement has a first layer and thereabove a second layer on at least one surface of the component,
wherein the first layer and the second layer each comprise an inorganic material,
wherein the first layer is arranged directly on the component,
wherein the second layer is arranged directly on the first layer,
wherein the first layer and the second layer each have a volume structure,
wherein the volume structure of the second layer is independent of the volume structure of the first layer, and
the volume structure of the second layer has a higher amorphicity than the volume structure of the first layer.

2. A device comprising:
a component; and
an encapsulation arrangement for the encapsulation of the component with respect to moisture and/or oxygen,
wherein the encapsulation arrangement has a first layer and thereabove a second layer on a third layer on at least one surface of the component,
wherein the third layer is arranged directly on the component,
wherein the first layer is arranged directly on the third layer,
wherein the second layer is arranged directly on the first layer,
wherein the first layer and the second layer each comprise an inorganic material,
wherein the third layer comprises an amorphous inorganic material,
wherein the first layer and the second layer each have a volume structure,
wherein the volume structure of the second layer is independent of the volume structure of the first layer, and
the volume structure of the second layer has a higher amorphicity than the volume structure of the first layer.

3. A device comprising:
a component; and
an encapsulation arrangement for the encapsulation of the component with respect to moisture and/or oxygen, wherein the encapsulation arrangement has a first layer and thereabove a second layer on at least one surface of the component, wherein the first layer and the second layer each comprise an inorganic material, wherein the second layer is arranged directly on the first layer, wherein the encapsulation arrangement is hermetically impermeable at a temperature of greater than or equal to 60° C. and at a relative air humidity of greater than or equal to 85% for longer than 500 hours, wherein the first layer and the second layer each have a volume structure, wherein the volume structure of the second layer is independent of the volume structure of the first layer, and the volume structure of the second layer has a higher amorphicity than the volume structure of the first layer.

4. The device as claimed in claim 2, wherein the second layer and the third layer are embodied identically.

5. The device as claimed in any of claims 1, 2 and 3, wherein the second layer is amorphous.

6. The device as claimed in any of claims 1, 2 and 3, wherein the second layer has a thickness having a thickness variation which is independent of a surface structure and/or a volume structure of the first layer.

7. The device as claimed in claim 6, wherein the thickness variation is less than or equal to 10%.

8. The device as claimed in any of claims 1, 2 and 3, wherein the encapsulation arrangement has a plurality of first layers and a plurality of second layers, and wherein the first and second layers are applied alternately one above another.

9. The device as claimed in any of claims 1, 2 and 3, wherein the encapsulation arrangement completely encloses the component.

10. The device as claimed in any of claims 1, 2 and 3, wherein the device has a plurality of encapsulation arrangements arranged on different surfaces of the component.

11. The device as claimed in any of claims 1, 2 and 3, wherein the component comprises a substrate, and wherein the encapsulation arrangement is applied directly on the substrate.

12. The device as claimed in any of claims 1, 2 and 3, wherein the component has a covering on a substrate, and wherein the encapsulation arrangement is arranged between the covering and the substrate.

13. The device as claimed in claim 12, wherein a connecting material is arranged between the covering and the substrate, and wherein the encapsulation arrangement encapsulates an interface between the substrate and the connecting material and/or between the covering and the connecting material.

* * * * *